United States Patent [19]

Trystram

[11] Patent Number: 5,570,326
[45] Date of Patent: Oct. 29, 1996

[54] DEVICE FOR MEASURING THE DURATION OF A TIME INTERVAL

[75] Inventor: Philippe Trystram, Saint Egreve, France

[73] Assignee: Commissariat a l'Energie Atomique, France

[21] Appl. No.: 259,714

[22] Filed: Jun. 14, 1994

[30] Foreign Application Priority Data

Jul. 2, 1993 [FR] France .................................. 93 08145

[51] Int. Cl.$^6$ .............................. G04F 8/00; G04P 10/00
[52] U.S. Cl. ............................................. 368/113; 368/119
[58] Field of Search ............................ 368/113, 118–120; 324/185; 364/569

[56] References Cited

U.S. PATENT DOCUMENTS

| | | | |
|---|---|---|---|
| 4,164,648 | 8/1979 | Chu | 368/118 |
| 4,234,881 | 11/1980 | Stauers | 368/118 |
| 4,562,549 | 12/1985 | Tanaka et al. | 364/486 |
| 4,786,861 | 11/1988 | Hulsing et al. | 368/118 |
| 5,200,933 | 4/1993 | Thornton et al. | 368/113 |

FOREIGN PATENT DOCUMENTS

| | | |
|---|---|---|
| 0077075 | 4/1983 | European Pat. Off. . |
| 0448182 | 9/1991 | European Pat. Off. . |

OTHER PUBLICATIONS

Index to Proceedings of the IRE vol. 45, 1957 pp. 21–30 "The Vernier Time–Measuring Technique" by: Rob G. Baron.
IEEE Transactions on Nuclear Science Oct., 1973 vol. NS–20, No. 5, pp. 36–51, By: Porat "Review of Sub–Nanosecond Time–Interval Measurements".

*Primary Examiner*—Vit N. Miska
*Attorney, Agent, or Firm*—Hayes, Soloway, Hennessey, Grossman & Hage, P.C.

[57] ABSTRACT

A device for measuring the duration of a time interval between an interval start signal (D) and an interval end signal (F). The device includes a digital circuit having first and second clocks (C1, C2) for counting the number of clock pulses between the interval start signal (D) and the interval end signal (F), an analog circuit for measuring the time separating the interval start signal (D) from a clock pulse following the interval start signal, and also for measuring the time separating the interval end signal (F) and a clock pulse following the interval end signal, and a processing circuit for determining the duration of the time interval based upon data supplied the digital circuit and data supplied by the analog circuit (previously converted into digital data). Particular utility for the present invention is found in the area of robotics.

17 Claims, 3 Drawing Sheets

DEVICE FOR MEASURING THE DURATION OF A TIME INTERVAL

BACKGROUND OF INVENTION

FIELD OF THE INVENTION

The invention relates to a device for measuring the duration of a time interval.

The field of the invention is that of precise time measurement, of resolution of approximately a few dozen picoseconds, for very long measured time intervals, e.g. approximately 1 microsecond, said measurement being performed rapidly.

BRIEF DESCRIPTION OF RELATED PRIOR ART

In the field of the accurate measurement of time, use is made of averaging methods or other methods which considerably increase the acquisition time of the value of the measurement compared with the measured time. Averaging is only possible if the measured phenomenon has an appropriate stationarity relative to the averaging time.

The user of a frequency vernier, as described in the article entitled "The Vernier Time-Measuring Technique" by Robert G. Baron (Proceedings of the Ire, January 1957) seeks a beat and therefore extends in a non-negligible manner the measuring time (5 microseconds measuring time for a resolution of 20 picoseconds with 100 MHz clocks). This has the effect of limiting the number of measurements possible below the. implementation time of certain events.

In addition, purely analog systems are not particularly suitable for the measurement of long time intervals, due to the instability of the memory used with such intervals ($\geq 100$ ns) or the deterioration of the signal for circulation and coincidence systems.

In the field of the invention different successive events and the speed of the measurement determine the acquisition frequency of the images, so that it is important for it to be fast (measurement time $\leq 8$ µs→, frequency $\geq 125$ KHz). In all cases, subsequent to the acquisition of the parameters of the measurement, a calculation has to be carried out requiring a proper time, which can be relatively independent of the upstream measurement procedure. Therefore the repetition frequency is dependent on the measurement method of the time and the conversion of the result. The prior art is described in the article entitled "Review of Sub-Nanosecond Time-Internal Measurements" by Dan. I. Porat (Stanford University).

French patent application 8 905 654 filed on 28.4.1989 describes a movement or flight time measurement telemetry process and a device for performing it. The time measurement takes place according to the interpolation-expansion method. The application of this method does not include a device making it possible to avoid the counting error of a clock stroke in certain ambiguity situations. Moreover, the duration of the measurement is 10 microseconds without counting the calculation and conversion times.

The object of the invention is to propose a precise measuring device for long measured time intervals.

SUMMARY OF THE INVENTION

The invention relates to a device for measuring the duration of a time interval between a start signal and an end of interval signal comprising:

a digital circuit provided with first and second clocks for counting the number of clock pulses between the start signal and the interval end signal, an analog circuit for measuring the time separating the interval start signal from the following clock pulse and also for measuring the time separating the interval end signal from the following clock pulse, a processing circuit for determining the duration of the time interval on the basis of data supplied by the digital circuit and data supplied by the analog circuit previously converted into digital data;

wherein the digital circuit is provided with a second clock, whose pulses are shifted by a half-period T with respect to those of the first clock and means able to determine which of the counts performed on one of the two clocks is to be taken into account so as to resolve any ambiguity situation which might lead to a clock period counting error.

In a first embodiment, the interval start signal is synchronous of the first clock and the digital circuit comprises: a type RS flip-flop controlled by the start signal D on its SET input and by the delayed interval end signal F, after passing into a delay network, on its RESET input;

a first block having:
   first counter,
   a first type D flip-flop,
   a first AND circuit;

a second block having:
   a second counter,
   a second type D flip-flop,
   a second AND circuit; and a detecting circuit having a memory able to perform an OR function for detecting which among the outputs of the type D flip-flops has switched first.

In a second embodiment, the interval start signal is not synchronous with the first clock and the digital circuit comprises:

a type RS flip-flop controlled by the delayed start signal after passing into a first delay network on its SET input and by the delayed interval end signal, after passing into a delay network identical to the first delay network of its RESET input;

a first block having:
   a first counter,
   a first type D flip-flop,
   a first AND circuit,
   a first OR circuit,
   a second AND circuit,
   a time shaping means for the signal;

a second block having:
   a second counter,
   a second type D flip-flop,
   a third AND circuit,
   a second OR circuit,
   a fourth AND circuit,
   a time shaping means for the signal; and a detecting circuit having a memory able to perform an OR function to detect which among the outputs of the type D flip-flops has switched first.

The analog measuring circuit incorporates a voltage amplitude storage and conversion circuit followed by an analog/digital conversion circuit.

In the first embodiment, in the first block, the first counter receives on its authorization input CE a counting instruction from the type RS flip-flop, the data outputted from the first counter being transmitted to the processing circuit by means of a switching circuit controlled by an OR circuit, the first type D flip-flop receiving the interval end signal F on its input D and the first clock on its clock input, the first AND circuit performing the AND function for the output of the first type D flip-flop and the second clock.

In the second embodiment, in the first block, the first counter receives on its authorization input CE a counting instruction from the type RS flip-flop, the data outputted from the first counter being transmitted to the processing circuit by means of a switching circuit controlled by an OR circuit. The first type D flip-flop controlled by a first OR circuit receives the start signal and the interval end signal on its input D and the first clock on its clock input. The first AND circuit performs the AND function for the output of the first type D flip-flop and the second clock.

In the first embodiment, in the second block, the second counter receives on its authorization input CE a counting instruction from the type RS flip-flop, the data from said counter being transmitted to the processing circuit by means of a switching circuit, the second type D flip-flop receiving the interval end signal on its input D and the second clock on its clock input. The second AND circuit performs the AND function between the output of said D flip-flop and the first clock.

In the second embodiment, in the second block, the second counter receives on its authorization input a counting instruction from the type RS flip-flop. The data of said counter are transmitted to the processing circuit by means of a switching circuit. The second type D flip-flop controlled by a second OR circuit receives the start signal and the interval end signal on its input D and the second clock on its clock input. The second AND circuit performs the AND function between the output of said D flip-flop and the first clock.

The output of the detecting circuit having a memory controls the operation of the switching circuit to bring about the reading of the counter, whose associated type D flip-flop has not switched first. This switching circuit is connected by a flip-flop to the processing circuit and supplies it with data relative to the selected counter. It detects the first of the type D flip-flops which has switched and authorizes the reading of the counter, whose type D flip-flop has not changed state. This flip-flop is a type RS flip-flop receiving on its SET input the delayed interval end signal and on its RESET input an OR circuit connected to the outputs of the AND circuits. Its output supplies a signal to the voltage amplitude storage and conversion circuit.

In the first embodiment, the analog circuit incorporates a storage circuit comprising:

two generators able to supply currents of equal amplitude and opposite signs, a capacitor, and two switches able to switch the currents from the two generators to the capacitor and which are controlled by the type RS flip-flop, receiving the delayed interval end signal on its SET input and the interval start signal on its RESET input.

In the second embodiment, the analog circuit incorporates a storage circuit comprising:

two generators able to supply currents of equal amplitude and opposite signs, a capacitor, and two switches able to switch the currents from the two generators to the capacitor and which are controlled by type RS flip-flops and receiving in the first case, the delayed interval end function of the output of the first and third AND circuits on its SET input and the OR signal connected to its RESET input and for the second the delayed interval start function of the output of the first and third AND circuits on its SET input and the OR signal connected to its RESET input.

The interval end signal is delayed by a sufficiently long time compared with the unit propagation time of the operators used in order to ensure that the clock brings about a time shift of each of the counting channels between the counter and the associated flip-flop D. This duration must be short compared with the clock period.

For example, the interval end signal F is delayed by 3*(tpd) (tpd=propagation time). The same applies with respect to the interval start signal in the second variant.

The device according to the invention can e.g. be used for producing an image sensor for robotics, which requires a large number of precise measurements every second and which are known as movement or flight time measurements, of a laser pulse, the time to be measured being that taken by a light pulse in order to go and come from a transmitter and a receiver having undergone a reflection on a target (movement time).

DETAILED DESCRIPTION OF PREFERRED EMBODIMENTS

In order to measure the duration of a given time interval, the device according to the invention measures the approximate part of the time interval in digital manner and the fine part in analog manner. The thus acquired parameters are combined to obtain the result. Therefore the time measurement is obtained by associating a digital quantity in the form of a number of counted clock periods and an analog quantity by the conversion of a voltage amplitude time.

Figure 1:
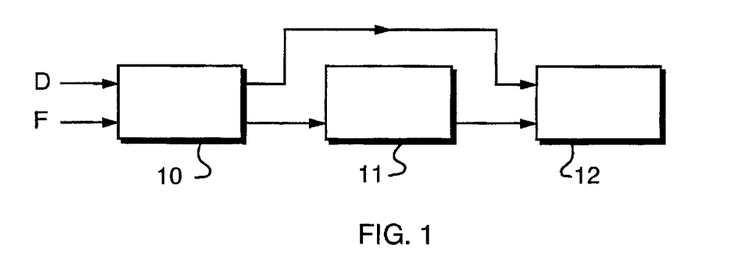
FIGS. 1 to 3 illustrate the device according to the invention and the operation thereof.

The measuring device according to the invention shown in FIG. 1 consequently comprises a digital measuring circuit 10 receiving the pulses D and F of the start and finish of the interval and whereof one of the outputs is directly connected to a processing circuit 12 and whereof the other output is connected to said circuit 12 across an analog measuring circuit 11.

Figure 2:
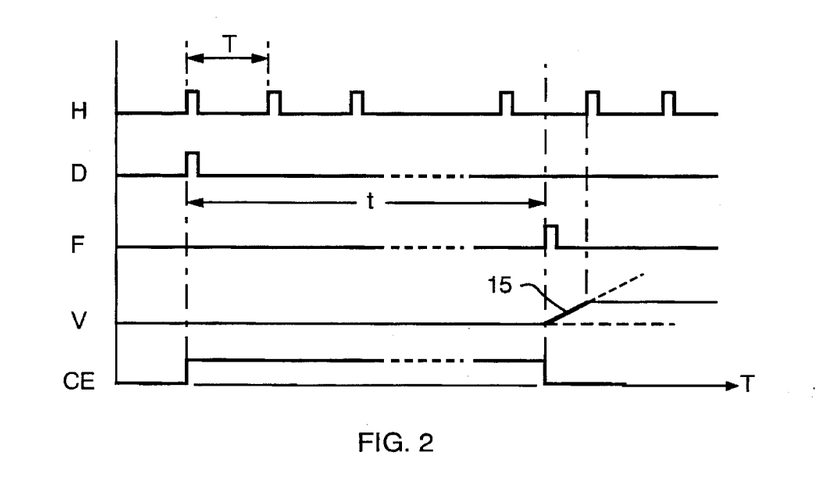

In the operating diagram of the device according to the invention shown in FIG. 2, there is the starting pulse D, synchronous with a recurrent clock signal H of pulses of period T and the interval end pulse to be measured F.

As from the leading front of the pulse D, the clock signal pulses H are counted in a counter, the signal F stops the counter and initiates a voltage ramp 15, which is stopped by the leading front of the pulse of the clock signal following the signal F. Unlike in the case of signal D, the signal F occurs in random manner with respect to the clock signal. The signal CE is the validation signal of the clock pulse counter. The amplitude V reached by the ramp corresponds to a fraction K of the period T, such that:

$$V = f(kT) \tag{1}$$

If the content of the counter is N, the expression of the duration of the sought time interval is:

$$t=(N+1-K)T \qquad (2)$$

The acquisition of the quantities V and N takes place in real time during the measurement, the equation (1) making it possible to obtain K by means of an analog/digital conversion and equation (2) gives the time expressed on the basis of the clock period. The analog quantity V is obtained by switching a current in a capacitor for the time KT. The desired digital quantity is obtained in the counter.

The width of the signals D and F is between ½ and a whole clock period so as to have a coincidence probability of the clock front and the signals equal to one. If the signals are too narrow, one of them (F or D) or both of them may not be counted.

With regards to the result of the digital acquisition the following observations can be made. When the signals F and H are simultaneously present, the counter can count the clock pulse, which the signal F should have prevented. There is an ambiguity situation which can lead to an error of one clock period.

Figure 3:
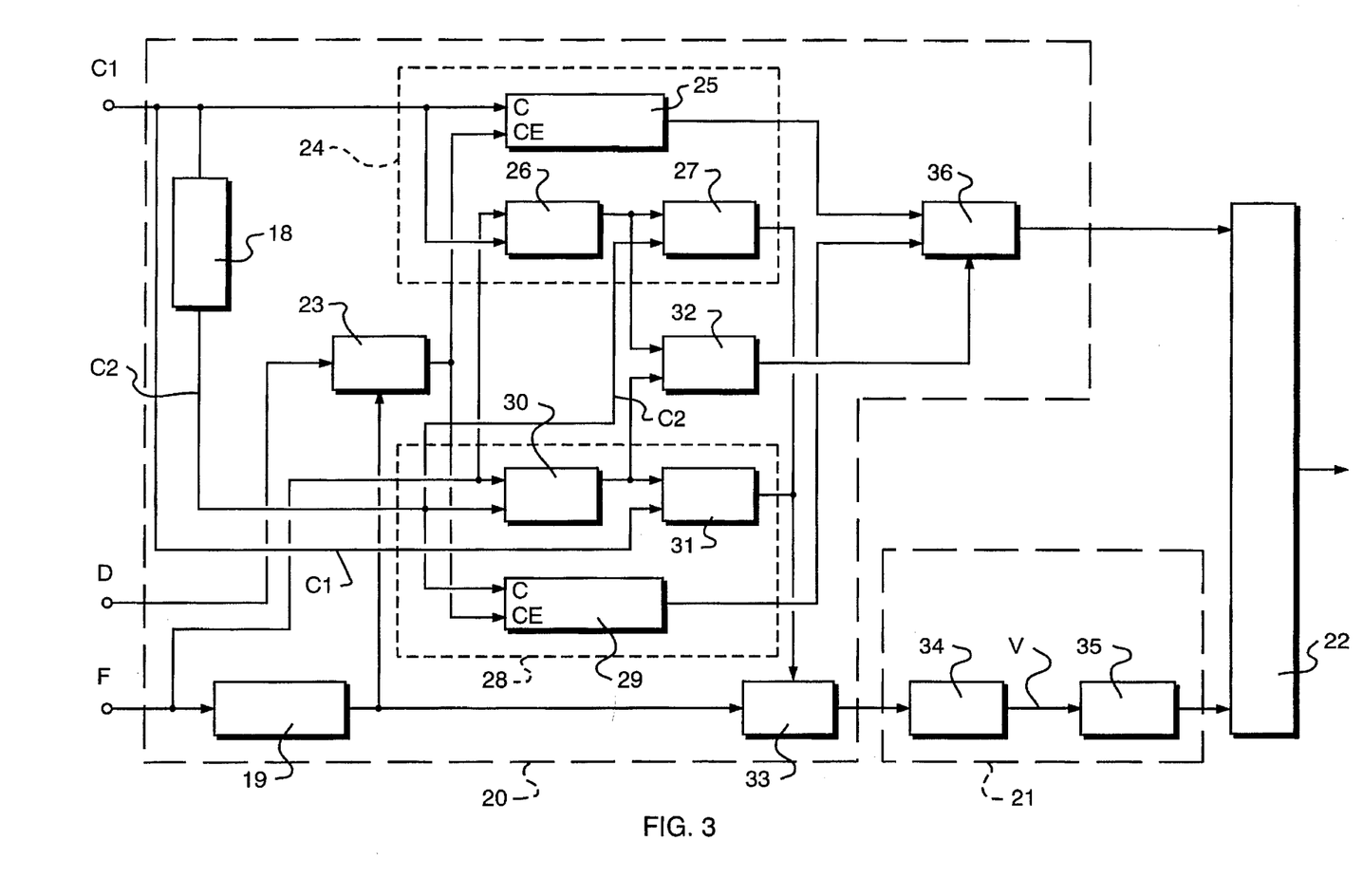

So as to avoid this ambiguity, the device according to the invention shown in FIG. 3 comprises two counting channels for two clock signals C1 and C2 of the same frequency, time shifted by a half-period (delay network 18). The measurement result taken into account is that of the channel where no ambiguity has been possible. In addition, in said channel there is a shift of the presence instant of the signal F (delay network 19) on the circuits which it controls. This device comprises a digital circuit 20, an analog circuit 21 and a processing circuit 22.

The digital circuit 20 is provided with a first clock C1 and a second clock C2, whose pulses are shifted by a half-period T compared with those of the first clock C1.

The digital circuit 20 also comprises:

a type RS flip-flop 23, controlled by the starting signal D on its SET input and by the delayed interval end signal F, after passing into the network 19, on its RESET input;

a first block 24 having:
 a first counter 25,
 a first type D flip-flop 26,
 a first AND circuit 27;

a second block 28 having:
 a second counter 29,
 a second type D flip-flop 30,
 a second AND circuit 31;

a circuit 32 having a memory, able to perform an OR function in order to detect which among the outputs of the circuits 26 and 30 has switched first.

In the first block 24, the first counter 25 receives on its authorization input CE a counting instruction from the flip-flop 23. The data outputted from the first counter 25 are transmitted to the processing circuit 22 by means of a switching circuit 36 controlled by an OR circuit 32. The first type D flip-flop 26 receives the signal F on its input D and the first clock C1 on its clock input. The first AND circuit 27 performs the AND function of the output of the clock C2 and the flip-flop 26.

In the second block 28, the second counter 29 receives on its authorization input CE a counting instruction from the flip-flop 23. The data of said counter 29 are transmitted to the processing circuit 22 by means of the circuit 36. The second type D flip-flop 30 receives the signal F on its input D and the second clock C2 on its clock input. The second AND circuit 31 performs the AND function between the output of said circuit 30 and the clock C1.

The output of the circuit 32 controls the operation of the switching circuit 36 in order to obtain the reading of the counter 25 or 29, whose type D flip-flop (26 or 30) has not switched first. It detects the first of the flip-flops 26 or 30 which has switched. It authorizes the reading of the counter, whose flip-flop has not changed state. The circuit 36 is connected by a flip-flop 33 to the processing circuit 22 and supplies it with data relative to the selected counter.

The analog measuring circuit 21 comprises a voltage amplitude storage and conversion circuit 34 followed by an analog/digital conversion circuit 35. The analog measuring circuit 21 is controlled by the flip-flop 33 able to measure the time separating the delay end signal of the clock pulse following it. The circuit 35 makes it possible to convert the analog data obtained at the output of the circuit 34 into digital data. The duration of the signal at the output of the flip-flop 33 represents the fine part of the time interval which is to be measured. This flip-flop 33 controls the circuit 34 by triggering the voltage rise ramp V.

The flip-flop 33 is a RS flip-flop receiving on its SET input the delayed signal F and on its RESET input an OR function of the outputs of the AND circuits 27 and 31. Its output supplies a signal controlling the circuit 34 and which is stopped by the following clock pulse C1 or C2 (previously selected clock).

The processing circuit 22 receives on the one hand the data from the selected counter 25 or 29 and on the other the output signal of the flip-flop 33, converted into a voltage by means of the circuit 34, which is digitized by the circuit 35.

The operation of the device 35 is based on the use of a controlled time shift between the actions of the delay end signal F on the counter and an ambiguity identification circuit in each of the channels.

The two counters 25 and 29 respectively receive the clock signals C1 and C2 on their counting inputs and a signal on their authorization inputs CE. The four type D flip-flops 26, 30, 33 and 23 have SET-RESET controls. The flip-flops 26 and 30 receive the clocks C1, C2 and the signal F on their inputs D. Their outputs are respectively mixed on two AND circuits 27, 31 with the clock signals C2, C1. The authorization input CE of the counters is controlled by the signal F delayed e.g. by approximately 3*(tpd) (propagation time). Assuming an uncertainty condition on the counter 29 between CE and C2, such a situation cannot simultaneously exist on flip-flop 30 as a result of the time shift of 3*(tpd). Thus, the flip-flop30 is activated. The clock signal C1 stops the circuit 34 by means of the AND circuit 31. The counter 25, which has operated outside any uncertainty situation is then read. In an identical situation on the counter 25, the circuit 34 is stopped by C2 and the counter 29 is read.

Moreover, when there is an uncertainty situation on one of the circuits 26 or 30, it leads to a metastable state, i.e. an indefinite state varying from 0 to 1 on its output, which lasts no longer than a few nanoseconds (<<T/2). It is therefore the circuit working with the dual clock shifted by a half-period which is activated and carries out the switching.

These operating conditions are guaranteed by a very precise control of the propagation times of the signals. The circuits used have propagation times and anticipation/maintenance times which are taken into account for the positioning of the signals.

A resetting of the counters 25 and 29 takes place before any measurement by a conventional, not shown device. Following each measurement, the data contained in the processing circuit 22 are transferred to units such as e.g. measurement calculation and control units.

The dual character of the two measuring channels is affirmed in the topology, the positioning and distribution of the circuits in the boxes or cases. Advantageously the flip-flops 26 and 30 are located in the same case. The clock signals C1 and C2 which control them consequently traverse the same number of operators in identical cases. Therefore any thermal drift is differentially compensated. Certain circuits are used as signal time lag and redistribution elements. The passages of the clock signals are identical as regards copper length and traversed operators. The lines are all at the defined impedance 50 or 100 ohms and matched with respect to their characteristic impedance in order to avoid oscillation and reflection phenomena. Averaging this precise control of the times in the very high speed logic circuits used (frequency approximately 1 GHz) and links between the circuits avoids any error in the acquisition of the measurement parameters.

In an advantageous embodiment the time/voltage amplitude conversion transconductance is regulated in such a way that it is possible to process in the same binary word the content of the counter and the result of the analog/digital conversion of the output V of the time/voltage amplitude converter. The content of each counter is a binary word, whose least significant bit or LSB e.g. represents 10 nanoseconds. The result of the digital conversion of the time 1 voltage amplitude is a binary word. The conversion transconductance of the converter 34 is regulated in V/ns in such a way that the most significant bit or MSB of the word of said converter e.g. represents five nanoseconds. Thus, the two digital words are adjacent and the access time to the result is substantially equal to the conversion time.

Moreover, the combination of the two digital and analog measurements making it possible to count large time intervals without any limitation other than that of the capacity of a digital memory, has no ambiguity and makes it possible to achieve the results of the measurements obtained for short time intervals. The precision on the time is linked with the resolution of the converter 35. In a "well finished" construction of the device, it is possible to achieve a resolution of about 10 picoseconds, which is equivalent to the best existing instruments.

This measurement of the time interval duration can be used in producing an image sensor for robotics, which requires a large number of precise measurements every second, so-called movement time measurements, of a laser pulse. The time to be measured is that taken by a light pulse in order to go and return from a transmitter to a receiver after under-going a reflection on a target (movement time). Thus, the work takes place on the electrical pulse corresponding to the light pulse. The time measuring circuit is then adapted to a telemeter. The time is measured with an accuracy of 20 picoseconds in a laser shot at a rate of one point of the image per measurement. The relationship obtained is Tmeasurement=outward/return duration+processing time (dead time). As the image is not stationary, there is one laser shot per pixel.

As a digital example, with an analog/digital conversion time of 100 nanoseconds, it is possible to measure times of approximately 1 microsecond with an accuracy of 40 picoseconds and a recurrence close to 1 MHz. In the production of a three-dimensional display for mobile robotics, the device according to the invention is realized on a 3 $dm^2$ electronic card having six electrical coatings with links matched to a defined impedance.

Figure 4:
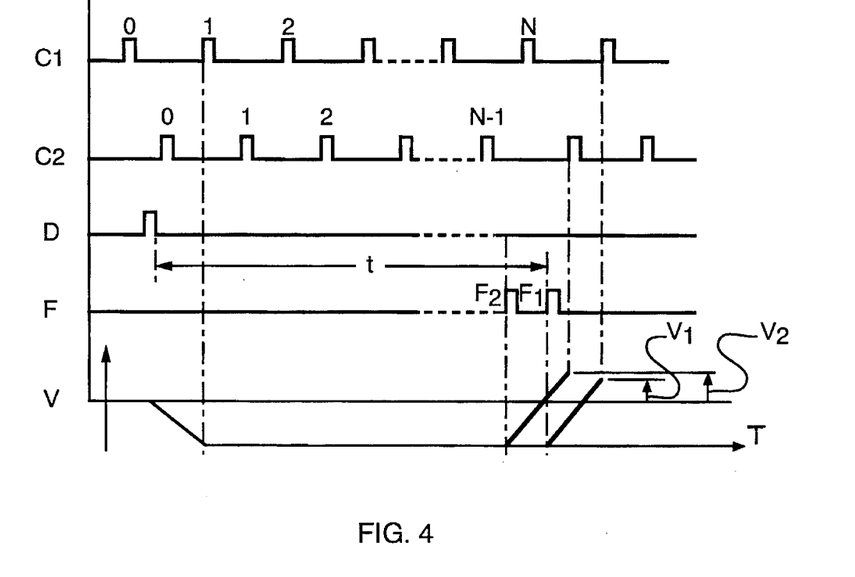
FIG. 4 illustrates the operation of a variant of the device according to the invention.
Figure 5:
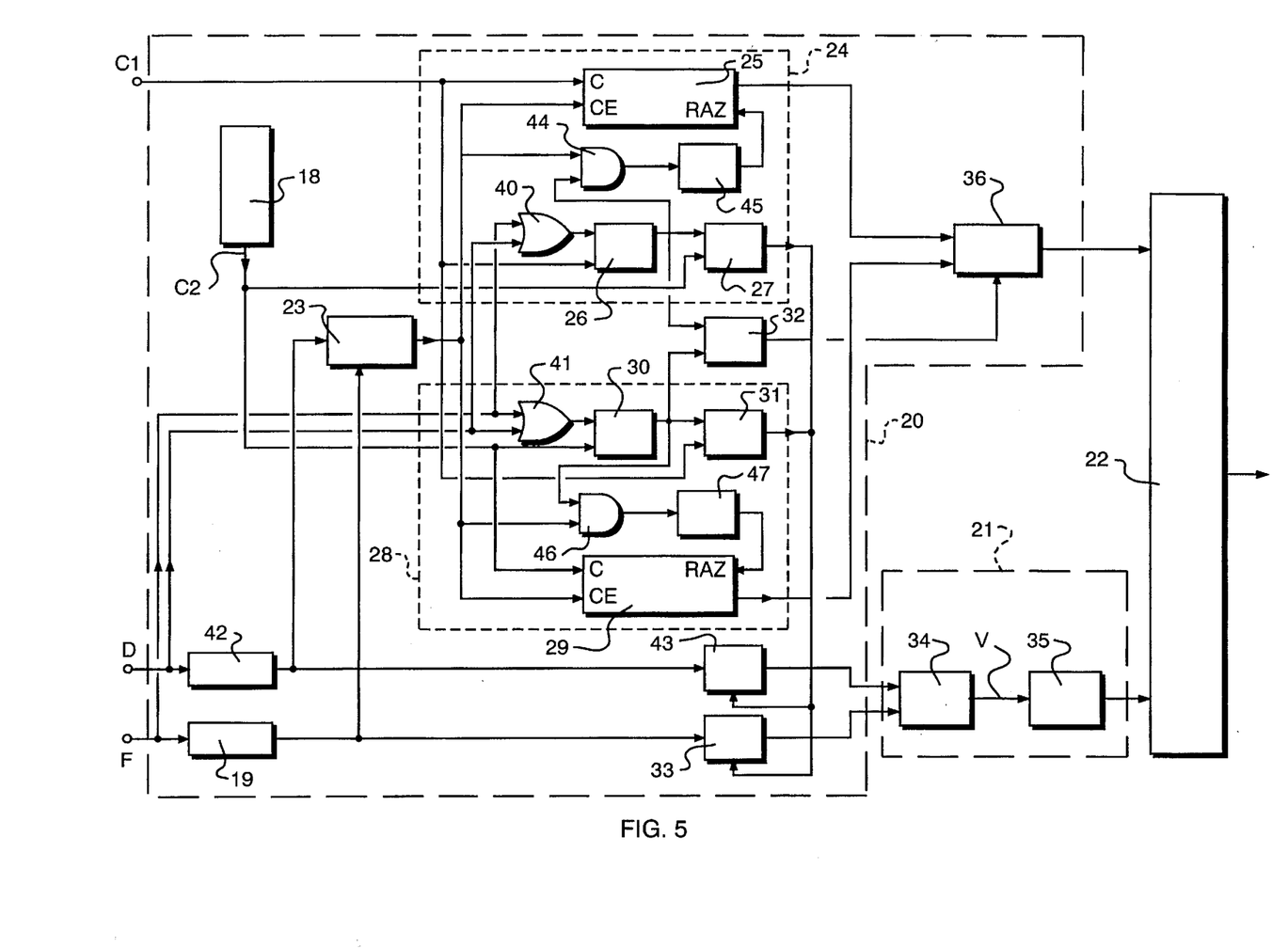
FIG. 5 illustrates another variant of the device according to the invention.

In an embodiment of the invention, the start D and end F signals of the time interval to be measured are not referenced in either case to a clock signal, as illustrated by FIGS. 4 and 5. The signal D triggers a discharge of the capacitance of the circuit 34, which is stopped by one of the clock pulses C1 or C2. The counters are then enabled. In the same way as in the previous description, if there is an uncertainty situation with respect to the start of counting for one of the counters, the first of the presence identification circuits 26 or 30 which switches validates the choice between the clocks C1 or C2 for stopping the discharge of the capacitance and the counter which has counted the first clock pulse in a reliable manner.

On curve F are represented two interval end situations designated by the positions F1 and F2. On curve V, V2 corresponds to the amplitude reached by the analog device corresponding to F2 and V1 to F1. Thus, in this variant, the time measurement takes place without a starting time reference.

The start D and end F signals of the time interval to be measured are not referenced to the clock signal, as illustrated in FIG. 4.

So as to be able to solve any uncertainty situation on the signal D, as has been done for signal F, the signal D is processed in the same way by the same operators. This gives the variant shown in FIG. 5.

The D flip-flops 26 and 30 henceforth receive the signals D or F by means of an OR function 40, 41 on their input D. The flip-flop 23 which supplies the authorization signal CE is also controlled by the signals D and F, both delayed by a quantity close to 3*(tpd) (19, 42).

The capacitance of the circuit 34 is associated with two generators of identical current and opposite signs controlled by the flip-flops 33 and 43, which are respectively triggered by the signals D and F. The signal D triggers a discharge of the capacitor, which is stopped by one of the clock pulses C1 or C2. The counters are then authorized.

As in the preceding description, if there is an uncertainty condition at the start of counting for one of the counters, the first of the presence identification circuits 26, 30 to switche validates the choice between the clocks C1 and C2 in order to stop the discharge of the capacitor and also chooses the counter which has counted the first clock pulse in a reliable manner.

The validated counter is left unchanged, whereas the other counter is reset prior to the arrival of the second clock pulse following the signal D, so that its content is made reliable. This is carried out by circuits 44, 45 and 46, 47 respectively for the first and second counters. The circuits 44 and 46 are AND circuits, the circuits 45 and 47 are used to time form.

The signal F triggers a charging of the capacitor with a mirror of the current used to discharge it previously. As the preceding device, it stops the counters and identifies which should be read.

The value of the measured time is given by the equation:

$$t=(N-K)T \qquad (3)$$

If the validated counter is not the same during the processing of the signals D and F, the equation to be used becomes:

$$t=(N+\tfrac{1}{2}-K)T \qquad (4)$$

As soon as the signal D arrives, the capacitor is the source of a discharge corresponding to the time preceding the start of validated counting, i.e. to be added to the time represented by the content N of the counter. Following the arrival of the signal F, said capacitor also stores a charge corresponding to the time between the signal F and a clock pulse following the signal F, i.e. to be subtracted from the counter content. The capacitor integrates these functions provided that its charge has not varied between two discharge/charge phases.

I claim:

1. A device for measuring duration of a time interval between a start signal and an end of an interval end signal, and comprising:

a digital circuit having first and second clocks and for counting respective numbers of clock pulses generated by said clocks between the start signal and a clock pulse following the end of the interval end signal, an analog circuit for measuring a time period separating the interval end signal and the clock pulse following the interval end signal, and a processing circuit for calculating the duration of the time interval from first data supplied by the digital circuit and second data supplied by the analog circuit previously converted into digital data;

wherein the pulses generated by the second clock are shifted by a half-period T with respect to those generated by the first clock and the digital circuit has means for determining which respective number of pulses of said first and second clocks is to be taken into account to determine the duration of said time interval so as to resolve any ambiguity situation which might lead to a clock period counting error.

2. A device according to claim 1, wherein the interval start signal is synchronous with the first clock and wherein the digital circuit is also for generating a delayed end signal and further comprises:

a first type RS flip-flop controlled by the start signal and by the delayed end signal;

a first logic having:
a first type D flip-flop connected to the first clock,
a first AND circuit connected to the first type D flip-flop;

a second logic block having:
a second type D flip-flop connected to the second clock,
a second AND circuit connected to the second D type flip-flop; and
a detecting circuit having a memory for performing an OR function for detecting which among the first and second D type flip-flops has switched first.

3. A device according to claim 1, wherein the start signal is not synchronous with the first clock and wherein the digital circuit is also for generating delayed start and interval end signals and further comprises:

a first type RS flip-flop controlled by the delayed start signal and by the delayed end signal;

a first logic block having:
a first type D flip-flop connected to the first clock,
a first AND circuit connected to said first type D flip-flop,
a first OR circuit also connected to said first type D flip-flop,
a second AND circuit connected to the first type D flip-flop and to a first counter,
a first time shaping means for the signal connected to the second AND circuit and to the first counter;

a second logic block having:
a second type D flip-flop connected to the second clock,
a third AND circuit connected to the second type D flip-flop,
a second OR circuit connected to the second type D flip-flop,
fourth AND circuit connected to the second type D flip-flop and to a second counter,
a second time shaping means for the signal connected to the fourth AND circuit to the second counter; and a detecting circuit having a memory for performing an OR function to detect which among the flip-flops has switched first.

4. A device according to claim 1, wherein the analog circuit comprises a voltage amplitude storage and conversion circuit and an analog/digital conversion circuit.

5. A device according to claim 2, wherein a first counter receives a counting instruction from the first type RS flip-flop, wherein data outputted from the first counter are transmitted to the processing circuit by means of a switching circuit controlled by the detecting circuit, wherein the interval end signal is supplied to the first and second type D flip-flops, and the first AND circuit is connected to the second clock and to an output of the first type D flip-flop.

6. A device according to claim 3, wherein the first counter receives a counting instruction from the first type RS flip-flop, wherein data outputted from the first counter are transmitted to the processing circuit by means of a switching circuit controlled by the detecting circuit, wherein the first type D flip-flop receives the start signal and interval end signal and is connected to the first clock.

7. A device according to claim 5, wherein a second counter also receives a counting instruction from the first type RS flip-flop, wherein data of said second counter are transmitted to the processing circuit by means of switching circuit, wherein the second type D flip-flop receives the interval end signal and is connected to the second clock and wherein the second AND circuit is connected to one of said type D flip-flops and the first clock.

8. A device according to claim 6, wherein a second counter receives a counting instruction from the type RS flip-flop, wherein data of said second counter are transmitted to the processing circuit by means of switching circuit, wherein the second type D flip-flop receives the start signal and interval end signal and is connected to the second clock and wherein the second AND circuit is connected to said first type D flip-flop and the first clock.

9. A device according to claim 7 wherein the output of the detecting circuit controls the operation of the switching circuit so as to obtain a reading of one of the counters, that is connected to a type D flip-flop that has not switched first and wherein said switching circuit is connected to the processing circuit and supplies the processing circuit with data related to the selected counter.

10. A device according to claim 9, further comprising a second type RS flip-flop receiving the delayed end signal and being connected to an OR circuit connected to outputs of the AND circuits and wherein the second type RS flip-flop supplies a control signal to a voltage amplitude storage and conversion circuit.

11. A device according to claim 2, wherein the analog circuit comprises a storage circuit comprising:

a generator for supplying a current, a switch for switching the current from the generator to a capacitor, and a second type RS flip-flop for receiving the delayed end signal and the start signal.

12. A device according to claim 3, wherein the analog circuit includes a storage circuit comprising:

two generators for supplying currents of equal amplitude and opposite signs, two switches for switching the currents from the two generators to a capacitor, and second and third type RS flip-flops for receiving the delayed end signal, the delayed and for being connected to an OR circuit connected to the first and third AND circuits.

13. A device according to claim 11, wherein the interval end signal is delayed by approximately three times a propagation time, tpd.

14. A device according to claim 12, wherein the interval start and end signals are delayed by a lag approximately equal to three times a propagation time, tpd.

15. A method for using the device of claim 1, wherein the device is used in an image sensor for a robot application requiring a large number of precise movement time measurements of a laser pulse per second, and the time interval to be measured is a movement time defined as that time required by a light pulse to go and return from an emitter or transmitter to a receiver after having undergone a reflection on a target.

16. A device according to claim 8 wherein the detecting circuit controls the switching circuit in such a way as to obtain reading of one counter whose type D flip-flop has not switched first and wherein said circuit is connected to the processing circuit and supplies the processing circuit with data related to the selected counter.

17. A device according to claim 16, and further comprising second and third type RS flip-flops, said second type RS flip-flop receiving the delayed end signal the third type RS flip-flop receives the delayed begin signal, and the second and third type RS flip-flops are connected to an OR circuit connected to outputs of the AND circuits and the second and third type RS flip-flops supply control signals to a voltage amplitude storage and conversion circuit.

* * * * *

UNITED STATES PATENT AND TRADEMARK OFFICE
CERTIFICATE OF CORRECTION

PATENT NO.   :  5,570,326
DATED        :  October 29, 1996
INVENTOR(S)  :  Philippe Trystram It is certified that error appears in the above-indentified patent and that said Letters Patent is hereby corrected as shown below:

Claim 12, Column 10, line 65, please insert --start signal-- after "delayed" (second occurence).

Signed and Sealed this

Twenty-fourth Day of December, 1996

*Attest:*

BRUCE LEHMAN

*Attesting Officer*    *Commissioner of Patents and Trademarks*